(12) United States Patent
Chen et al.

(10) Patent No.: US 9,316,903 B2
(45) Date of Patent: Apr. 19, 2016

(54) FLEXIBLE NANOIMPRINT MOLD, METHOD FOR FABRICATING THE SAME, AND MOLD USAGE ON PLANAR AND CURVED SUBSTRATE

(71) Applicant: Nanjing University, Nanjing (CN)

(72) Inventors: Yanfeng Chen, Nanjing (CN); Haixiong Ge, Nanjing (CN); Zhiwei Li, Nanjing (CN); Changsheng Yuan, Nanjing (CN); Minghui Lu, Nanjing (CN)

(73) Assignee: Nanjing University, Nanjing (CN)

( * ) Notice: Subject to any disclaimer, the term of this patent is extended or adjusted under 35 U.S.C. 154(b) by 36 days.

(21) Appl. No.: 14/500,240

(22) Filed: Sep. 29, 2014

(65) Prior Publication Data
US 2015/0024308 A1    Jan. 22, 2015

Related U.S. Application Data

(62) Division of application No. 12/393,672, filed on Feb. 26, 2009, now Pat. No. 8,871,048.

(30) Foreign Application Priority Data

Nov. 4, 2008    (CN) .......................... 2008 1 0195525

(51) Int. Cl.
*B29C 59/00* (2006.01)
*G03F 1/76* (2012.01)
*B29C 33/40* (2006.01)
*B82Y 10/00* (2011.01)
*B82Y 40/00* (2011.01)
(Continued)

(52) U.S. Cl.
CPC *G03F 1/76* (2013.01); *B05D 1/005* (2013.01); *B29C 33/40* (2013.01); *B29C 59/022* (2013.01); *B82Y 10/00* (2013.01); *B82Y 40/00* (2013.01); *G03F 7/0002* (2013.01); *G03F 7/20* (2013.01); *B29K 2083/00* (2013.01); *Y10T 156/1023* (2015.01)

(58) Field of Classification Search
CPC ........ B29C 59/00; B29C 59/005; B29C 59/16
USPC ..................... 264/330, 331.11, 337
See application file for complete search history.

(56) References Cited

U.S. PATENT DOCUMENTS

| 5,772,905 A | 6/1998 | Chou |
| 6,180,239 B1 | 1/2001 | Whitesides et al. |

(Continued)

OTHER PUBLICATIONS

Schmid, et al., "Siloxane Polymers for High-Resolution, High-Accuracy Soft Lithography", Macromolecules, Mar. 25, 2000, vol. 33, No. 8, pp. 3042-3049, American Chemical Society.

(Continued)

*Primary Examiner* — Christina Johnson
*Assistant Examiner* — Xue Liu
(74) *Attorney, Agent, or Firm* — Chen Yoshimura LLP

(57) ABSTRACT

The present invention provides a flexible nanoimprint mold which can fabricate sub-15 nm ultra fine structures on either planar or curved substrates. The mold comprises a top ultra-thin rigid layer of imprint patterning features and a bottom thick flexible layer of polymer elastomer. The two distinct layers are preferably integrated via chemically bonding. The top layer of the mold enables a sub-15 nm resolution of pattern fabrication and the bottom layer affords a conformal contact to planar or curved surface of substrates. The methods for fabricating the same are disclosed.

24 Claims, 3 Drawing Sheets

(51) Int. Cl.
    *G03F 7/00* (2006.01)
    *B05D 1/00* (2006.01)
    *B29C 59/02* (2006.01)
    *G03F 7/20* (2006.01)
    *B29K 83/00* (2006.01)

(56) References Cited

U.S. PATENT DOCUMENTS

| | | | |
|---|---|---|---|
| 6,334,960 B1 | 1/2002 | Willson et al. | |
| 2002/0168278 A1* | 11/2002 | Jeon et al. | 417/559 |
| 2003/0156992 A1* | 8/2003 | Anderson et al. | 422/100 |
| 2007/0098899 A1 | 5/2007 | Wessels et al. | |
| 2007/0285406 A1 | 12/2007 | Kukulj et al. | |
| 2008/0000373 A1 | 1/2008 | Petrucci-Samija et al. | |
| 2010/0061892 A1* | 3/2010 | Flaim et al. | 422/68.1 |

OTHER PUBLICATIONS

Odom, et al., "Improved Pattern Transfer in Soft Lithography Using Composite Stamps", Langmuir, May 16, 2002, vol. 18, No. 13, pp. 5314-5320, American Chemical Society.

* cited by examiner

FLEXIBLE NANOIMPRINT MOLD, METHOD FOR FABRICATING THE SAME, AND MOLD USAGE ON PLANAR AND CURVED SUBSTRATE

BACKGROUND OF THE INVENTION

1. Field of the Invention

The present invention relates to a nanoimprint technology, and more particularly, to a flexible imprint mold for patterning ultra-fine nanostructures on a planar or curved substrate and the method for fabricating the same.

2. Description of the Related Art

Nanoimprint lithography is one of the promising technologies for patterning ultra-fine nanostructures with a sub-10 nm resolution by high volume and low cost. In nanoimprint lithography, a mold with nanostructures, generally fabricated on stiff materials such as silicon, silicon dioxide, and quartz wafers, is pressed into polymer film to form relief patterns according to nanostructures of the mold. Nanoimprint lithography is described in detail in U.S. Pat. No. 5,772,905. The usual nanoimprint lithography process of pressing the mold into the thin film of thermoplastic polymer involves applying high pressure and temperature that may limit the application of this method. U.S. Pat. No. 6,334,960 describes a process called "step and flash imprint lithography" that utilizes a mold with a relief structure, which is pressed into polymerizable fluid composition at ambient pressure and room temperature. The polymerizable composition is then subjected to conditions to polymerize the polymerizable fluid composition and form a solidified polymeric material. The mold is then separated from the solidified polymeric material such that a replica of the relief structure in the mold is formed in the solidified polymeric materials.

Micro- and nanostructures on curved substrates should be useful in areas requiring lithography fabrication in three dimensions: examples include lenses and optical fibers, electronic devices shaped to reduce the length of interconnects, and devices that conform to space limitations. However, nanoimprint lithography is typically practiced on planar structures. Both the molds and the substrates are planar. It has been difficult to extend current nanoimprint lithography to a curved substrate. The reason is that the stiff mold cannot provide a conformal contact with the nonplanar surface.

Soft lithography is currently one of useful techniques for patterning features and for fabricating structures on the size scale of 500 nm and larger. In contrast to using rigid molds to obtain high resolution in nanoimprint lithography, the most commonly used stamp material in soft lithography is soft and flexible poly(dimethylsiloxane) (PDMS), which enables it to have intimate physical contact with substrates without external pressure. The flexible character of the stamp can provide a conformal contact to curved substrate. (U.S. Pat. No. 6,180,239). However, the extension of this technique to produce sub-500-nm scale features was limited due to the low elastic modulus of PDMS used in fabricating stamps. Capillary forces, self-adhesion, and mechanical stresses produced during soft lithography process can deform the PDMS stamps or even cause parts of them to collapse, which leads to defective and inaccurate pattern transferring. Higher modulus (ca. 8 MPa) poly(dimethylsiloxane) (hard-PDMS) was developed to achieve resolution of soft lithography to sub-100-nm. (Schmid, H.; Michel, B. Macromolecules 2000, 33, 3042-3049). A composite stamp composed of two layers as a thin hard PDMS layer supported by a thick flexible PDMS layer was proposed to combine the advantages of both a rigid layer to achieve high resolution pattern transfer and an elastic support to enable conformal contact. There were still several intrinsic drawbacks to limit its application: (i) cutting and releasing it from the master caused cracking across the face of the stamp; (ii) the stamp would spontaneously break off the master during heating-cooling cycle because of the large difference of thermal expansion coefficient between the two materials; and (iii) external pressure was required to achieve conformal contact with a substrate, which created long-range, nonuniform distortions over the large areas of contact. (Odom, T. W.; Love, J. C.; Wolfe, D. B.; Paul, K. E.; Whitesides, G. M., Langmuir 2002, 18, 5314-5320).

SUMMARY OF THE INVENTION

Consequently, there is a need to provide a mold that combines the advantages of both nanoimprint lithography to achieve ultra-fine resolution pattern transfer and soft lithography to enable conformal contact without external pressure.

In view of the above technical problems of conventional art, a primary object of the present invention is to provide a flexible mold to combine the advantage of nanoimprint lithography for high resolution pattern transfer and the advantage of soft lithography for conformal contact between mold and substrate.

Another object of the present invention is to provide a method to fabricate the flexible mold with advantages of high resolution and conformal contact.

A further object of the present invention is to provide a flexible mold to imprint nano-scaled patterns with a sub-20 nm resolution on both planar and curved substrates.

To achieve the above objects, the present invention provides a flexible mold structure comprising: an ultra-thin rigid patterning feature layer and a thicker elastic polymer support. The rigid imprint feature layer is chemically coupled to the elastic support.

To achieve the above objects, the present invention provides a novel method of fabricating a flexible imprint mold including the following steps: a) providing an elastic polymer support; b) applying silicon containing photo-curable material to a mold master that has features to be duplicated as rigid patterning features on the flexible imprint mold; c) placing the elastic polymer support against the silicon containing photo-curable material covered mold master; d) using UV light exposure to cure the silicon containing photo-curable material; e) removing the flexible mold from the mold master; f) treating the surface of the flexible mold via $O_2$ reactive ion etching, and g) priming the treated surface of the flexible mold with trichloro-perfluoroalkyl silane.

According to the present invention, excellent UV-curing nanoimprint can be carried out by placing the flexible mold on the resist covered substrate and following a UV-light exposure without applying external pressure between the flexible mold and the planar or curved substrate. The treatment of the trichloro-perfluoroalkyl silane on mold surface facilitates an easy mold release from the substrate so that the flexible mold and the imprinted patterns are not damaged in the mold release process.

It is to be understood that both the foregoing general description and the following detailed description are exemplary and explanatory and are intended to provide further explanation of the invention as claimed.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

DETAILED DESCRIPTION OF THE PREFERRED EMBODIMENTS

Figure 1:
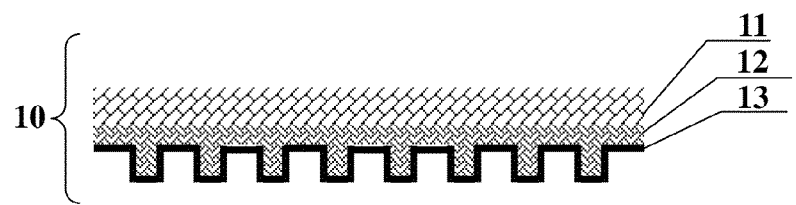
FIG. 1 is a schematic sectional view showing a flexible nanoimprint mold according to one embodiment of the invention.

Referring to FIG. 1 for the schematic structure of a flexible mold 10 for imprinting planar and curved substrate according to a preferred embodiment of the present invention, a flexible mold 10 comprises a double-layer structure: an ultra-thin rigid patterning feature layer 12 and a thicker elastic polymer support 11. A self-assembled monolayer (SAM) 13 of trichloro-perfluoroalkyl silane is coated onto the rigid patterning feature layer 12. The thickness of the rigid patterning feature layer 12 can be adjusted from 30 nm to 500 nm according to the height of the protruding and recess features on the mold master. The thickness of the elastic polymer support 11 can be adjusted from 0.1 mm to 3 mm. The rigid patterning feature layer 12 is chemically coupled to the elastic support 11. The rigid and elastic properties of the flexible mold layers are indicated by their tensile modulus. The tensile modulus of the rigid patterning feature layer 12 is preferably more than 20 N/mm$^2$ as a criterion for nanoscale replication, and more preferably over 100 N/mm$^2$. The tensile modulus of the elastic polymer support 11 is preferably from 1 to 15 N/mm$^2$, preferably less than 5 N/mm$^2$, and more preferably between 4 N/mm$^2$ and 1 N/mm$^2$. The rigid patterning feature layer 12 can be made from silicon containing photo-curable materials including but not limited to acrylate functionalized polysiloxane, methacrylate functionalized polysiloxane, epoxide functionalized polysiloxane, vinyl ether functionalized polysiloxane and mixtures thereof. The elastic polymer support 11 can be made from polymeric elastomers including but not limited to styrene-butadiene-isoprene polymeric elastomers, chlorobutyl rubber-styrene graft copolymer elastomers, ethylene/propylene rubber-styrene graft copolymer elastomers, polyurethane elastomers, polyester elastomers, and polydimethylsiloxane (PDMS) elastomer.

Referring to FIG. 2, a method of fabricating a flexible mold 10 for imprinting patterns on planar or curved substrate according to an embodiment is now described. The method includes the step of preparing a polymer elastic support 11 with a flat surface, as depicted in FIG. 2(a). For example, the elastic polymer support 11 may be a PDMS elastomer. The PDMS elastomer may be prepared from a liquid prepolymer 21 of Sylgard 184 PDMS by casting and curing between two silicon wafers 22. The area and thickness of the elastic support 11 can be adjusted by the area of silicon wafers 22 and the gap between them, respectively. Preferably, two silicon wafers 22 may be coated with a self-assembled monolayer (SAM) 13 of trichloro-perfluoroalkyl silane for lowering the surface energy of the silicon wafer 22 and assisting in releasing it from the elastic PDMS support 11 after curing.

Figure 2A:
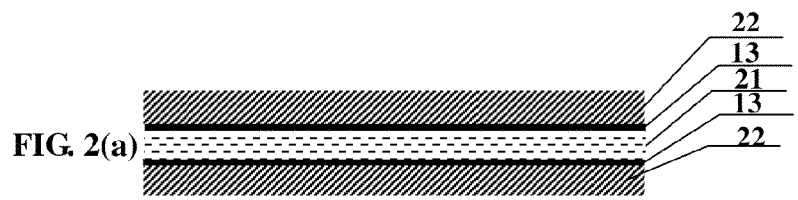
FIGS. 2(a) to 2(d) are schematic sectional views showing a method for fabricating the flexible nanoimprint mold of FIG. 1 according to an embodiment of the invention.
Figure 2B:
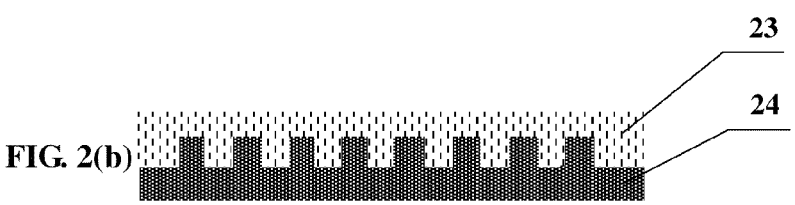
Figure 2C:
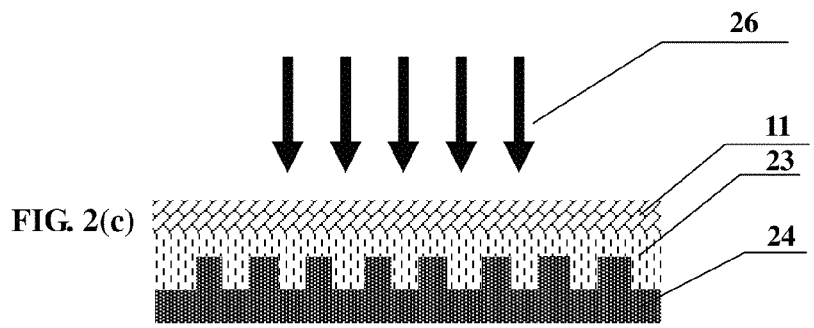

As depicted in FIG. 2(b), a thin uniform liquid film 23 of the silicon containing photo-curable material is preferably formed on the mold master 24 by spin-coating rather than on the PDMS support 11 for the reason of PDMS swelling in the organic solvent. The film thickness can be controlled from 30 to 500 nm depending on the height of the protruding and recess features on the mold master 24 by concentration of photo-curable materials and spin-coating speed. After spin-coating, the polymer elastic support 11, for example the PDMS elastomer support, is placed onto master mold 24. The soft and flexible properties of polymer elastic support 11 may make it possible to form a conformal contact with master mold 24 over a large area without external pressure, as depicted in FIG. 2(c). Then, the photo-curing process is carried out in a nitrogen atmosphere because oxygen molecules diffusing through the elastic support can inhibit the free-radical polymerization of the photo-curable materials. Preferably, the polymer elastomers in the present embodiment are transparent to broadband of UV-vis light. The photo-curable materials are exposed to UV radiation 26 with a dose around 30 mJ/cm$^2$ through the transparent polymer elastic support 11. The photo-curable material is then solidified to form the rigid patterning feature layer 12. After curing, the flexible imprint mold 25 is removed from the mold master 24. The solidified silicon containing photo-curable materials have a low surface free energy so that the flexible mold 25 is easily released from the mold master 24 without any damage.

Figure 2D:
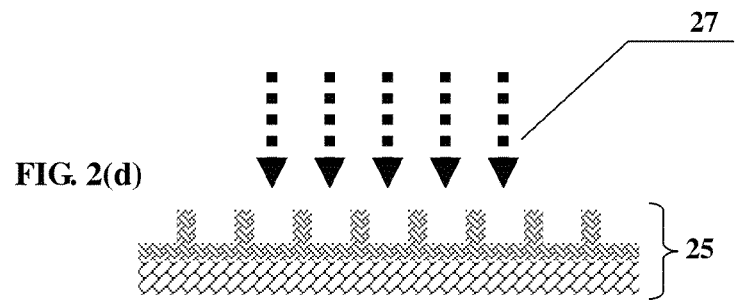

Although the solidified silicon containing photo-curable materials have a low surface free energy, the flexible imprint mold 25 is preferably coated with a self-assemble monolayer 13 of antiadhesion for better mold release after the imprint process. The trichloro-fluoroalkyl silane release agent is typically applied to silicon, silicon dioxide, or quartz molds via chemical reaction with silanol groups. It forms a fluorinated self-assembled monolayer 13 on the mold surface, which is used to provide a low surface free energy coating for better mold release. This release agent cannot be applied directly to the solidified silicon containing photo-curable materials due to the absence of silanol groups. As depicted in FIG. 2(d), the flexible mold is treated with O$_2$ plasma 27 to oxidize the near-surface region of the rigid patterning feature layer into silica. The silanol groups can be exposed on the rigid patterning feature layer surface. Then, the trichloro-fluoroalkyl silane release agent is applied to covalently link to the surface of the flexible mold 25 by vapor phase treatment. Thus, the flexible mold 10 is ready for further imprint application.

A distinct advantage to the flexible mold 10 in the present invention is that the rigid patterning feature layer 12 and the polymer elastic support 11 are integrally coupled by chemically bonded interpenetrating polymer network. As depicted in FIG. 2(c), for example, as PDMS elastic support 11 is placed onto a mold master 24 which has been spin-coated with a thin uniform film 23 of photo-curable mold material, the photo-curable molecules can automatically diffuse into the polymer crosslinked network of cured PDMS through the contact of the curable material film with the PDMS surface due to the intrinsic high permeability of PDMS for gases and organic molecules. In the stage of photo-curing process, the photo-curable materials spin-coated on the master mold 24 not only polymerize with themselves but also react with curable molecules diffused into the PDMS to form an integrally cross-linked polymer network. The photo-cured crosslinked polymer network of the UV-curable mold materials and the thermal cured crosslinked polymer network of PDMS composed an interpenetrating polymer network near the surface region of PDMS support 11, which made the rigid photo-cured features layer 12 and the elastic PDMS support 11 chemically bonded and provide an excellent adhesion of the two distinct layers. This strategy can significantly prevent the rigid layer 12 from peeling off the elastic support 11 during the mold release process.

Another distinct advantage to the flexible mold 10 is that desirable opposite mechanical properties, the rigid and elastic properties are integrated into a single flexible mold 10. High modulus of the rigid patterning feature layer 12 is the key point to achieve high resolution. On the other hand, a soft and elastic support 11 with high flexibility provides a conformal contact between mold and substrate without applying large imprint pressure.

The resolution of the flexible mold 10 is the minimum feature size of the pattern that can be formed in the solidified imprint resist by the flexible. One advantage of the flexible mold 10 is that a complex high resolution pattern with sub-100 nm can be imprinted on both planar substrate and curved substrate by the flexible mold 10. The resolution of the flexible mold 10 can be less 15 nm.

Another distinct advantage to the flexible mold 10 is that the ultra-thin thickness of the rigid patterning feature layer 12 may keep it free of cracks and fractures as it is bent with the elastic support in a certain degree for a conformal contact with the substrate or mold release from the substrate.

In one embodiment, the mold master 24 is fabricated using photolithography, interference lithography, electron beam lithography, nanoimprint lithography, combinations thereof, or other like techniques. Any suitable materials may be used for the mold master, examples of which include but are not limited to silicon, silicon dioxide, quartz, glass, metal, plastics, or combinations thereof.

After the flexible mold 10 has been formed, a resist to be imprinted with the flexible mold 10 is preferably a photo-curable fluid composition. The photo-curable fluid composition can be cured and solidified by the light passing through the flexible mold 10 during the imprint step or very soon thereafter. As one example, the resist can include but is not limited to NXR-2000 photo-curable resist from Nanonex Corp., AR-UV-01 photoresist polymer from Nanolithosolution Inc., or custom-made photo-curable fluid compositions. The photo-curable fluid composition in accordance with the embodiments of this invention is typically composed of at least a low viscosity curable fluid oligomer, an initiator and other ingredients or additives, such as, but not limited to, diluent, crosslinker, plasticizers and other materials. The term "oligomer" used herein means a polymer with low degree of polymerization which has a low viscous liquid state at room temperature or ambient conditions. The oligomers used in the photo-curable fluid composition preferably include various polymerizable pendant groups, such as, but not limited to, acrylate groups, epoxy groups, vinyl ether groups, and combinations of the above. The photo-curable fluid composition may polymerize via a variety of polymerization mechanisms such as, but not limited to, cationic polymerization, or free radical polymerization.

The application of the photo-curable resist on the substrate can be accomplished using a process including but not limited to spin coating, spraying, dipping, brushing, pouring, and spreading. Preferably, the spin coating is selected to form a uniform film of photo-curable resist on the substrate. The film thickness can be controlled by adjusting the concentration of the photo-curable resist and the spin speed. In this invention, the film thickness of the photo-curable resist can be precisely controlled in the range from 10±1 nm to 500±2 nm by spin coating technique. A solvent is applied to dilute or dissolve the photo-curable fluid composition for forming a uniform, thin film. Both nonreactive solvent and reactive monomer may be used to dilute or dissolve the curable fluid composition. Examples of a nonreactive solvents include, but not limited to, pentane, hexane, heptane, octane, chlorobenzene, toluene, xylene(s), acetone, methyl ethyl ketone, methyl isobutyl ketone, methyl formate, ethyl acetate, N,N-dimethylformamide, and mixtures thereof. Further preferably, to prevent potential problems from the residue of nonreactive solvent in the curable fluid composition after film formation, a reactive monomer or monomer mixture which may react and crosslink with the curable fluid composition during curing process is used to dilute or dissolve the curable fluid composition. Examples of reactive monomers, according to embodiments of the present invention, include but not limited to, epoxybutane, epoxypentane, epoxyhexane, cyclohexene oxide, butyl glycidyl ether, glycidyl acrylate, glycidyl methacrylate, methyl acrylate, methyl methacrylate, methyl crotonate, ethyl acrylate, ethyl methacrylate, ethyl crotonate, propyl acrylate, propyl methacrylate, propyl crotonate, butyl acrylate, butyl methacrylate, butyl crotonate, 1-vinyl-4-cyclohexene epoxide, vinyl acetate, vinyl ether, styrene and mixtures thereof.

Suitable materials for the substrate include but are not limited to silicon, silicon dioxide, quartz, glass, metal, polymer, composite material, and combinations thereof. Profiles of the substrate surface can be but are not limited to planar surface and curved surface. The curved surface can be convex and concave, respectively. The curved surfaces include, but are not limited to, spherical surface, cylindrical surface, arcuate surface, parabolic surface, and ellipsoidal surface.

As the photo-curable resist (e.g. NXR-2000 photo-curable resist) film is formed on the substrate by a spin coating method, the flexible mold 10 and the substrate covered with photo-curable resist are urged into contact with each other. A tool such as a pair of tweezers or vacuum clamping plate can be used to grasp the backside of the flexible mold 10 and then place it onto the substrate. The soft and flexible properties of the elastic support 11 of the flexible mold 10 make it possible to conformal contact with the substrate without external pressure. As the mold contacts the thin fluid resist film, the low viscous photo-curable resist having good flow ability may fill the recess portions of the feature on the flexible mold 10 in an automatic manner due to capillarity. The photo-curable resist is then subjected to photo-curing conditions so as to polymerize the photo-curable resist and solidify the resist film to form the imprinted patterns from the flexible mold 10. Preferably, the photo-curable resist is exposed to ultraviolet light. The photo-curing can occur in an air ambient or in a gas ambient (e.g. nitrogen) and room temperature. Finally, a tool such as a pair of tweezers or vacuum clamping plate can be used to grasp the backside of the flexible mold 10 and peeling the flexible mold 10 off or lift the flexible mold 10 off the substrate. A relief pattern corresponding to the feature in flexible mold 10 is formed in the solidified resist film. The solidified film can be processed to remove the reduced thickness portions of the relief pattern. This removal exposes the underlying substrate for further processing.

Figure 3:
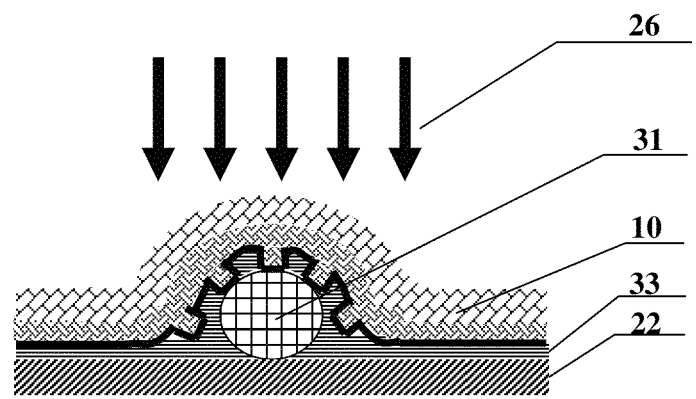
FIG. 3 is a schematic sectional view showing a method of applying the flexible mold of FIG. 1 on a cylindrical substrate.
Figure 4:
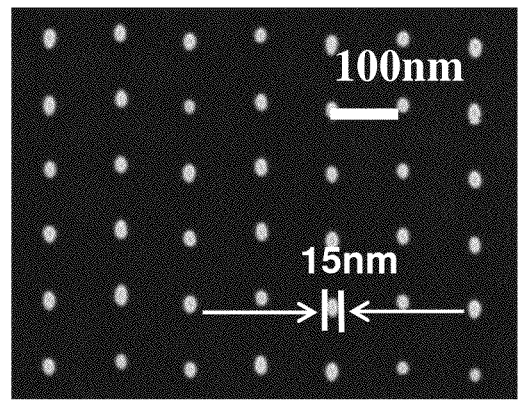
FIG. 4 is a scanning electron micrograph of a top view of 15 nm dots with a 100 nm pitch formed by the flexible mold of FIG. 1.
Figure 5:
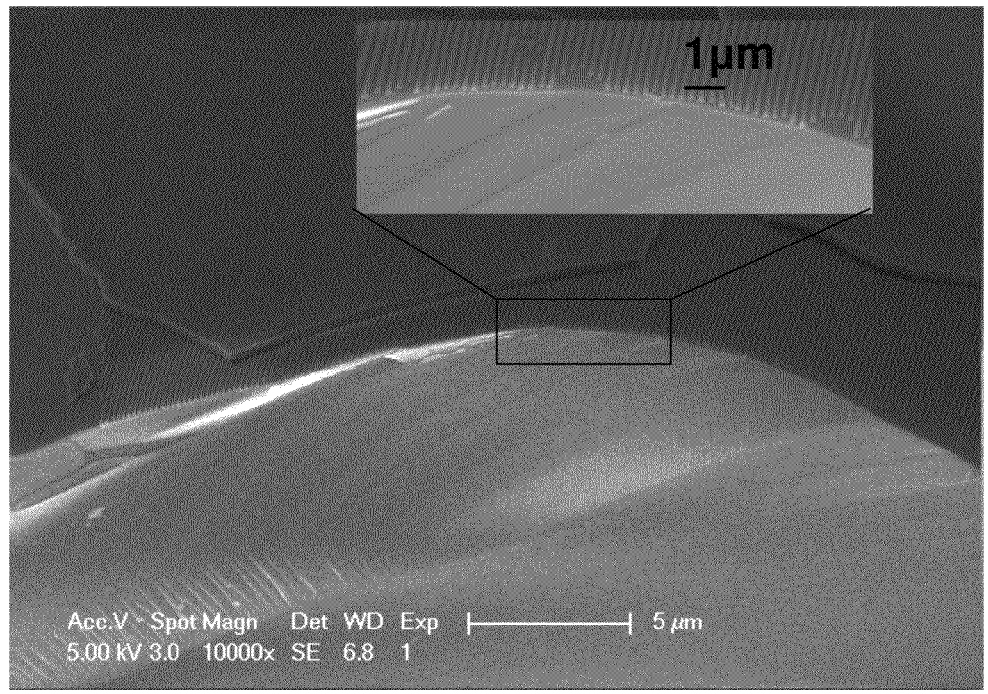
FIG. 5 is a scanning electron micrograph of a perspective view of 200 nm pitch grating on an optical fiber with a 125 µm diameter parallel with the fiber axis formed by the flexible mold of FIG. 1. A large part of the grating area was covered with an overturned grating film peeled off from another fiber segment as the fiber was cut off for SEM measurement.
Figure 6:
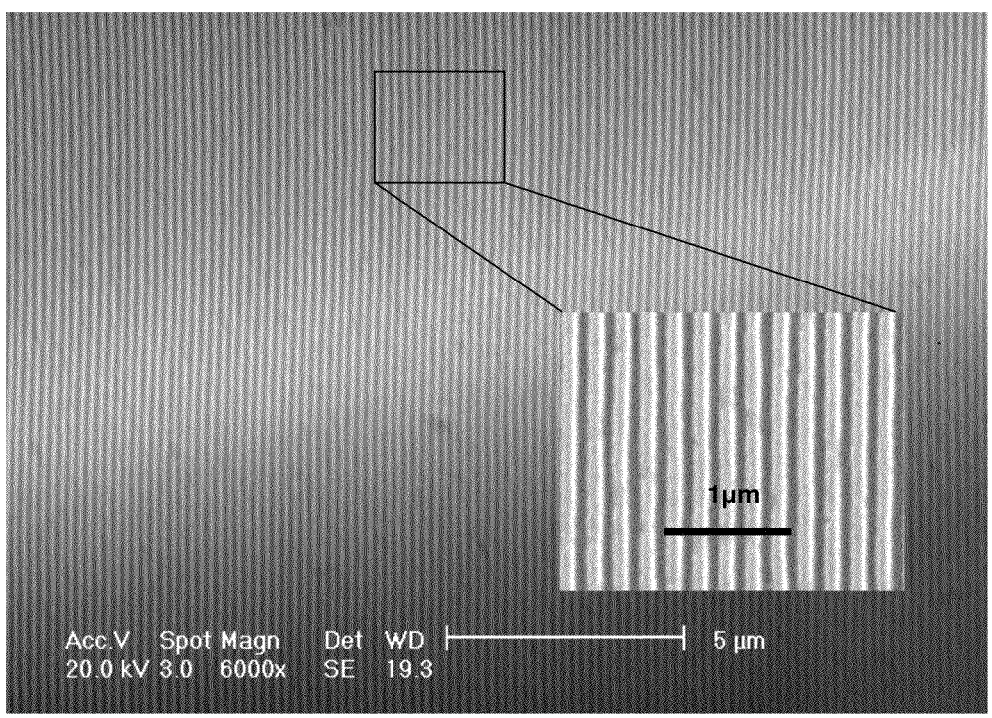
FIG. 6 is a scanning electron micrograph of a top view of a 200 nm pitch grating on an optical fiber with a 125 µm diameter perpendicular to the fiber axis formed by the flexible mold of FIG. 1.

Referring to FIG. 3, the flexible mold 10 can be applied to imprint curved surface. As one example, a cylindrical single-mode optical fiber 31 (125 μm in diameter) is selected as a curved substrate. A segment of the cylindrical optical fiber is fixed on the surface of a Si wafer 22. The photo-curable resist 33 is spin-coated on the curved surface. Therefore the imprint and photo-curing process of the flexible mold 10 on the curved surface can be carried out as described above.

It will be apparent to those skilled in the art that various modification and variations can be made in the above-described structure and method of the present invention without departing from the spirit or scope of the invention. Thus, it is intended that the present invention cover modifications and variations that come within the scope of the appended claims and their equivalents.

What is claimed is:

1. A method of fabricating a flexible imprint mold, comprising:
   (a) preparing a polymer elastic support, which has a thickness from 0.1 mm to 3 mm and a tensile modulus from 1 to 15 $N/mm^2$;
   (b) forming a film of a silicon containing photo-curable material on a mold master;
   (c) placing the polymer elastic support onto the mold master;
   (d) using a UV radiation to cure the silicon containing photo-curable material in a nitrogen atmosphere to form a rigid patterning feature layer, which has a tensile modulus of more than 20 $N/mm^2$ and a thickness from 30 nm to 500 nm;
   (e) removing the polymer elastic support and the rigid patterning feature layer from the mold master; and
   (f) oxidizing a near-surface region of the rigid patterning feature layer into silica.

2. The method of claim 1, wherein the elastic polymer support includes a polydimethylsiloxane (PDMS) support.

3. The method of claim 2, wherein the PDMS support is prepared by casting and curing liquid prepolymer of PDMS between two silicon wafers.

4. The method of claim 3, wherein an area of the PDMS support is adjusted by an area of the silicon wafers.

5. The method of claim 3, wherein a thickness of the PDMS support is adjusted by a gap between the two silicon wafers.

6. The method of claim 3, wherein the two silicon wafers are coated with a self-assembled monolayer of trichloro-perfluoroalkyl silane.

7. The method of claim 1, wherein the mold master is made from a material selected from silicon wafer, silicon dioxide, quartz, glass, metal, and plastic.

8. The method of claim 1, wherein the mold master is fabricated by a method selected from photolithography, interference lithography, electron beam lithography, nanoimprint lithography, and combinations thereof.

9. The method of claim 1, wherein the film of the silicon containing photo-curable material is formed on the mold master by spin coating.

10. The method of claim 9, wherein a film thickness of the silicon containing photo-curable material is controlled by a concentration of the silicon containing photo-curable materials and a spin coating speed.

11. The method of claim 1, wherein the oxidizing step is performed using $O_2$ plasma.

12. The method of claim 1, further comprising:
    coating a fluorinated self-assembled monolayer on a surface of the rigid patterning feature layer.

13. The method of claim 12, wherein in the coating step the self-assembled monolayer is trichloro-perfluoroalkyl silane.

14. A method of fabricating a flexible imprint mold, comprising:
    (a) preparing a polymer elastic support, which has a tensile modulus from 1 to 15 $N/mm^2$;
    (b) forming a film of a silicon containing photo-curable material on a mold master;
    (c) placing the polymer elastic support onto the mold master;
    (d) using a UV radiation to cure the silicon containing photo-curable material in a nitrogen atmosphere to form a rigid patterning feature layer, which has a tensile modulus of more than 20 $N/mm^2$ and an imprint resolution of less than 15 nanometers;
    (e) removing the polymer elastic support and the rigid patterning feature layer from the mold master; and
    (e) oxidizing a near-surface region of the rigid patterning feature layer into silica.

15. The method of claim 14, wherein the elastic polymer support includes a polydimethylsiloxane (PDMS) support.

16. The method of claim 15, wherein the PDMS support is prepared by casting and curing liquid prepolymer of PDMS between two silicon wafers.

17. The method of claim 16, wherein an area of the PDMS support is adjusted by an area of the silicon wafers.

18. The method of claim 16, wherein a thickness of the PDMS support is adjusted by a gap between the two silicon wafers.

19. The method of claim 16, wherein the two silicon wafers are coated with a self-assembled monolayer of trichloro-perfluoroalkyl silane.

20. The method of claim 14, wherein the film of the silicon containing photo-curable material is formed on the mold master by spin coating.

21. The method of claim 20, wherein a film thickness of the silicon containing photo-curable material is controlled by a concentration of the silicon containing photo-curable materials and a spin coating speed.

22. The method of claim 14, wherein the oxidizing step is performed using $O_2$ plasma.

23. The method of claim 14, further comprising:
    coating a fluorinated self-assembled monolayer on a surface of the rigid patterning feature layer.

24. The method of claim 23, wherein in the coating step the self-assembled monolayer is trichloro-perfluoroalkyl silane.

* * * * *